United States Patent [19]
Lee et al.

[11] Patent Number: 5,891,351
[45] Date of Patent: Apr. 6, 1999

[54] METHOD FOR FORMING PATTERN ON STEEL SUBSTRATE BY REACTIVE ION ETCHING

[75] Inventors: Chih-Kung Lee; Hong-Zong Liao; Shey-Shi Lu; Nien-Show Ho, all of Taipei, Taiwan

[73] Assignee: National Science Council, Taipei, Taiwan

[21] Appl. No.: 910,690

[22] Filed: Aug. 13, 1997

[51] Int. Cl.[6] .......................................................... B44C 1/22
[52] U.S. Cl. ................................................ 216/74; 216/75
[58] Field of Search .................. 216/74, 75, 71, 216/50

[56] References Cited

U.S. PATENT DOCUMENTS 5,348,616  9/1994  Hartman et al. ......................... 156/643
5,735,896  4/1998  Amon et al. ............................... 623/11

FOREIGN PATENT DOCUMENTS 3-150738  6/1991  Japan .

*Primary Examiner*—William Powell
*Assistant Examiner*—George Goudreau

[57] ABSTRACT

A method for forming a pattern on a surface of a steel substrate includes the formation of a patterned mask on the surface of the steel substrate. The entire surface having the patterned mask is etched by reactive ion etching such the a pattern is formed on the surface of the steel substrate. The reactive ion etching is brought about by a plasma which is produced in an atmosphere of a chlorine-containing compound, under pressure of 1–100 mTorr, and with a radio frequency power of 100–600 W.

1 Claim, No Drawings

METHOD FOR FORMING PATTERN ON STEEL SUBSTRATE BY REACTIVE ION ETCHING

FIELD OF THE INVENTION

The present invention relates generally to a method for forming a patterned texture on the surface of a steel substrate by the reactive ion etching, and more particularly to a method for forming a stereo-micropattern on a surface of a steel mold.

BACKGROUND OF THE INVENTION

The current method for forming a three-dimensional micropattern on the molding tool surface involves the formation of a stereo-micropattern on a photosensitive material by exposure. Subsequently, an electrically-conductive layer is formed on the patterned photosensitive material by a low-temperature vapor deposition or a silver plating before nickel or copper is electroplated to form the mold. However, the depth of the micropattern formed is often less than 0.15 $\mu$m in view of the residual stress when the electroplating is carried out by a sulfamate nickel plating method. On the other hand, an electroless nickel method is not a workable substitute for the above-mentioned electroplating method on the grounds that the electroless nickel method must be carried out at a relatively high temperature of 90° C., and that the photosensitive material and the substrate material are different from each other in heat expansion coefficient. Such problems can be technically overcome by a process in which the patterned photosensitive material is transferred to a silicon or glass substrate to form an unitary material by the dry or wet etching method before the electroless nickel method is executed. However, such a remedial measure as described above can complicate the entire method.

The embossing method disclosed by McGrew in the U.S. Pat. No. 5,521,030 was found by these inventors of the present invention to be inapplicable to the formation of the micropattern on the surface of a steel substrate by reactive ion etching, which was carried out under the conditions as follows:

1. Radio frequency (RF) power, 120 watts; reaction chamber pressure, 30 mTorr; and introduction of $CF_4$ gas at the flow rate of 36 SCCM and oxygen gas at the flow rate of 4 SCCM.

2. RF power, 120 watts; reaction chamber pressure, 40 mTorr; and introduction of $CF_4$ gas at the flow rate of 36 SCCM and argon at the flow rate of 4 SCCM.

3. RF power, 120 watts; reaction chamber pressure, 30 mTorr; and introduction of $SF_6$ gas at the flow rate of 40 SCCM.

4. RF power, 150 watts; reaction chamber pressure, 40 mTorr; and introduction of argon at the flow rate of 20 SCCM.

SUMMARY OF THE INVENTION

The primary objective of the present invention is therefore to provide an improved method for forming on a surface of a steel substrate a stereo-micropattern having a depth in excess of 0.15 $\mu$m. In addition, the steel substrate made by the method of the present invention has a longer service life span than the molding tool made by the prior art methods.

It is therefore another objective of the present invention to provide a method for forming a micropattern on the surface of a steel substrate by reactive ion etching.

In keeping with the principle of the present invention, the foregoing objectives of the present invention are attained by a method for forming a stereo-micropattern on a surface of a steel substrate by reactive ion etching. The method comprises forming a patterned mask on the surface of the steel substrate; and reactive ion etching a whole surface having thereon the patterned mask until such time when a pattern is formed on the surface of the steel substrate. The reactive ion etching is brought about by a plasma generated in an atmosphere of a chlorine-containing compound, under pressure of 1–100 mTorr, and with a radio frequency power of 100–600 W. The reactive ion etching involves an introduction of a gas of the chlorine-containing compound into a plasma reaction chamber, and preferably the flow rate of the chlorine-containing compound gas ranges from 5–100 SCCM. The method of the present invention is especially suitable for use in forming a stereo-micropattern on the surface of a molding tool made of steel or a steel alloy. The method of the present invention is relatively cost-effective and efficient as compared with the conventional method which involves the vapor deposition and the electroplating.

The chlorine-containing compound for use in the present invention can be any compounds which are capable of being excited by the plasma to produce chlorine ion, for example, $BCl_3$, $NCl_3$, $SiCl_4$, and chlorine-substituted methane or ethane.

A suitable method for forming the patterned mask in the method of the present invention includes coating a layer of a photosensitive material on the surface of the steel substrate, exposing and developing the photosensitive material to form a pattern in the photosensitive material layer. Preferably, a pattern formed by said patterned photosensitive material layer exposes a portion of the surface of the steel substrate. In this case, only the exposed portion of the surface of the steel substrate is etched by the reactive ion etching.

Alternatively, the pattern formed in the patterned photosensitive material layer does not cause the surface of the steel substrate to be exposed; and wherein the patterned photosensitive material layer has a surface provided with a sinusoidal pattern. In this case, the patterned photosensitive material layer and the surface of the steel substrate are sequentially etched.

Suitable steel substrates which are able to be formed a stereo-micropattern on the surfaces thereof include (but not limited to) carbon steel, chromium steel, tungsten steel, and tungsten chromium steel.

DETAILED DESCRIPTION OF THE PREFERRED EMBODIMENTS

The present invention discloses a method for forming a pattern on a surface of a steel substrate by reactive ion etching. The method of the present invention includes an initial step in which a patterned layer of a photosensitive material, for example, photoresist, is formed on the surface of the steel substrate. The photosensitive material layer is first exposed to an ultra-violet radiation via a photomask, or a laser interferenced stripes, or an electron beam (E-beam). The photosensitive material layer may also be exposed by using a laser writer. The exposed photosensitive material layer is then developed such that a desired pattern is formed in and/or on the photosensitive material layer. The steel substrate having the patterned layer thereon is then transferred to a plasma reaction chamber of a reactive ion etching machine. In the meantime, a gas of a chlorine-containing compound is introduced into the plasma reaction chamber in which the whole surface of the photosensitive material layer and the steel substrate is bombarded by the chlorine ions in conjunction with other positive ions. When the patterned photosensitive material layer enables a portion of the surface of the steel substrate to be exposed, only the exposed portion of the steel substrate is etched by the reactive ion etching.

In the event that the patterned photosensitive material layer does not cause the surface of the steel substrate to be exposed, and that the surface of the patterned photosensitive material layer has a wavy pattern, the patterned photosensitive layer and the surface of the steel substrate are sequentially etched by the reactive ion etching. Oxygen gas or argon gas may be selectively introduced together the chlorine-containing compound gas so as to approximately equalize the rates at which the steel molding tool and the photosensitive material are etched, thereby enabling the pattern formed on the surface of the steel substrate to be similar to that of the photosensitive material layer.

The steel substrate produced by the method of the present invention can be used as an embossing die or a mold in an extrusion molding process, or an injection molding process for forming a plastic material.

The method of the present invention will be more readily understood upon a thoughtful deliberation of the following detailed description of an embodiment of the present invention.

A preferred embodiment of the present invention included a first step in which a steel mold was polished and prepared such that the steel mold was provided in the back thereof with a plurality of threaded holes engageable with a main machine. The steel mold had a diameter of 3 inches and a thickness of 1.3 cm.

The prepared and polished steel mold was then washed with an organic solvent, such as acetone, and was subsequently rinsed with deionized water before being dried by a nitrogen gas current. It was then dried in an oven at 120° C.

The steel mold was then removed from the oven and allowed to cool in nitrogen gas before it was placed in a photoresist spinner, in which a photoresist (Fujihunt 6400L) was uniformly spin coated on the steel mold at 1500 RPM. The photoresist was subsequently soft-baked in an oven at 80° C.

An exposure device was provided with a 5×5 cm grating mask (32 micrometers being one period of the grating) and was used for forming a binary grating pattern of the photoresist on the steel mold by means of an ultra-violet radiation exposure (300 W G-line) for 120 seconds. The exposed photoresist was developed in a development solution FHD-5 for 30 seconds, and was then hard-baked at 120° C.

A reactive ion etching was carried out in a reaction chamber for 50 minutes to dry etch the surface of the steel mold having the patterned photoresist, wherein a plasma was generated with a radio frequency (RF) power of 120 W, at a pressure of 30 mTorr, and with a flow rate of 10 SCCM of $BCl_3$ gas which was introduced to the reaction chamber.

The residual photoresist was stripped by acetone. The grating formed on the steel mold was measured by a surface profiler (DEKTAK 3030). A grating having a period of 32 micrometers was found on the surface of the steel mold, with a distance between two adjoining grooves being 16 micrometers, with the width of the grooves being 16 micrometers, and with the depth of the grooves being 1000 Å.

A sinusoidal pattern will be formed in the photoresist when it is exposed with a gray-scale photomask or exposed by a laser interferenced stripes. In order to transfer this sinusoidal pattern to the steel mold, the etching rates of the steel mold and the photoresist have to be properly controlled by adjusting. the etching power, the nature of the reactive gas, as well as the flow rate and the pressure. In addition, the etching rate of the photoresist may be altered by an addition of oxygen or argon to the $BF_3$ so that the etching ratio between the steel mold and the photoresist is changed.

It is apparent that the method of the present invention can be applied to form a three-dimensional pattern on the surface of a steel mold or a steel alloy substrate in addition to the two-dimensional grating pattern formed in the embodiment. The method of the present invention is to be limited only by the scopes of the following appended claims.

What is claimed is:

1. A method for forming a pattern on a surface of a steel substrate, said method comprising the steps of:

(a) forming a patterned mask on the surface of the steel substrate; and (b) reactive ion etching a whole surface having thereon the patterned mask until such time when a pattern is formed on the surface of the steel substrate, the reactive ion etching being carried out in a plasma reaction chamber with a plasma which is generated in an atmosphere of a chlorine-containing compound having a pressure of 1–100 m Torr and by a radio frequency power of 100–600 W, and that a gas of the chlorine-containing compounds being introduced into the plasma reaction chamber at a flow rate in the range of 5–100 SCCM, and wherein additional oxygen gas and/or argon gas are introduced into the plasma reaction chamber to control the rates at which the photosensitive material and the steel substrate are etched by the reactive ion etching.

* * * * *